(12) United States Patent
Ma et al.

(10) Patent No.: US 11,824,548 B2
(45) Date of Patent: Nov. 21, 2023

(54) PULSE GENERATOR FOR INJECTION LOCKED OSCILLATOR

(71) Applicant: XILINX, INC., San Jose, CA (US)

(72) Inventors: Shaojun Ma, San Jose, CA (US); Chi Fung Poon, Sunnyvale, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/555,212

(22) Filed: Dec. 17, 2021

(65) Prior Publication Data

US 2023/0198530 A1 Jun. 22, 2023

(51) Int. Cl.
*H03L 7/099* (2006.01)
*G06F 1/06* (2006.01)
*H03K 17/687* (2006.01)

(52) U.S. Cl.
CPC .............. *H03L 7/0995* (2013.01); *G06F 1/06* (2013.01); *H03K 17/6872* (2013.01); *H03K 17/6874* (2013.01)

(58) Field of Classification Search
CPC ..... H03L 7/0995; G06F 1/06; H03K 17/6872; H03K 17/6874
See application file for complete search history.

(56) References Cited

U.S. PATENT DOCUMENTS

| | | | |
|---|---|---|---|
| 5,416,446 A * | 5/1995 | Holler, Jr. ............ | H03K 3/0315 331/25 |
| 6,211,709 B1 * | 4/2001 | Kim ..................... | H03K 5/1534 327/175 |
| 7,609,186 B1 * | 10/2009 | Rezzi ............. | H03K 19/018528 326/87 |
| 7,705,600 B1 * | 4/2010 | Byrkett .................. | G11C 29/12 365/201 |
| 9,401,698 B1 * | 7/2016 | Chan ...................... | H03K 5/156 |
| 9,762,242 B2 * | 9/2017 | Forghani-Zadeh ......................... | H03K 19/017509 |
| 10,014,868 B1 * | 7/2018 | Raj ............. | H03L 7/24 |

(Continued)

OTHER PUBLICATIONS

Erett, Marc et al. "A 126mW 56Gb/s NRZ wireline transceiver for synchronous short-reach applications in 16nm FinFET." 2018 IEEE International Solid—State Circuits Conference—(ISSCC) (2018): 274-276.

(Continued)

*Primary Examiner* — Metasebia T Retebo
*Assistant Examiner* — James G Yeaman
(74) *Attorney, Agent, or Firm* — Patterson + Sheridan, LLP (57) ABSTRACT

A multiplication injection locked oscillator (MIILO) circuitry includes a ring injection locked oscillator (ILO) circuitry that outputs clock signals, a first switching circuitry and a second switching circuitry. The ring ILO circuitry includes a first path having first delay stages, and a second path having a second delay stages. The first switching circuitry is connected to the first path and a voltage supply node. The first switching circuitry receives a first control signal and a second control signal and selectively connects the voltage supply node to the first path. The second switching circuitry is connected to the second path and a reference voltage node. The second switching circuitry receives the first control signal and the second control signal and selectively connects the reference voltage node to the second path.

18 Claims, 9 Drawing Sheets

(56) References Cited

U.S. PATENT DOCUMENTS

2007/0115271 A1* 5/2007 Seo .................. G09G 3/3688
345/204

OTHER PUBLICATIONS

Kanemaru, Norifumi et al. "A ring-VCO-based injection-locked frequency multiplier using a new pulse generation technique in 65 nm CMOS." 2011 International SoC Design Conference (2011): 32-35.

Raj, M. et al., "A 4-to-11GHz injection-locked quarter-rate clocking for an adaptive 153fJ/b optical receiver in 28nm FDSOI CMOS," 2015 IEEE International Solid-State Circuits Conference—(ISSCC) Digest of Technical Papers, 2015, pp. 1-3.

Chen, S. et al., "A 4-to-16GHz inverter-based injection-locked quadrature clock generator with phase interpolators for multi-standard I/Os in 7nm FinFET," 2018 IEEE International Solid—State Circuits Conference—(ISSCC), 2018, pp. 390-392.

* cited by examiner

PULSE GENERATOR FOR INJECTION LOCKED OSCILLATOR

TECHNICAL FIELD

Examples of the present disclosure generally relate to injection locked oscillators, and, more particularly, generating narrow pulse signals for high speed injection locked oscillators.

BACKGROUND

Communication systems include serializer/deserializer (SerDes) devices. The SerDes devices utilize polyphase interpolation to adjust the phase of the received signals and reduce errors. In one instance, polyphase interpolation uses multi-phase clock signals for phase adjustment. The multi-phase clock signals are generated from a lower frequency clock signal. In high speed communication systems, the clock signal is converted by pulse generator circuitry to a narrow pulse signal, which is used by a ring injection locked oscillator (ILO) circuitry to generate the multi-phase clock signals. In high speed communication devices (e.g., 200 Gbps or more), to generate high speed clock signals (e.g., 15 GHz or more), a narrow pulse signal having sharp rising and falling edges (e.g., fast rise and fall time) is needed. However, generating and transmitting narrow pulse signal with sharp rising and falling edges is power intensive as conventional solutions generate such a narrow pulse signal with high power buffer circuit elements. Further, as the frequency of the clock signals increases, conventional solutions are not able to consistently generate a narrow pulse signal with the needed rise and fall times to support the generation of the clock signals. Accordingly, the generated clock signals include phase errors and/or the targeted frequency of the clock signals is not able to be met.

In the following, a communication system that generates a narrow pulse with sharp rising and falling edges locally with respect to an injection locked oscillator is described. Accordingly, such a communication system uses less power and generates multi-phase clock signals that are less error prone than conventional communication systems.

SUMMARY

Communication systems utilize multiplication injection locked oscillator (MILO) circuitries to generate multi-phase clock signals from a narrow pulse signal. The narrow pulse signal is generated locally within a MILO circuitry. The MIILO circuitry includes ring injection locked oscillator (ILO) circuitry and injection circuitry. The injection circuitry includes switching circuitries that generate a narrow pulse signal which is injected into the ring ILO circuitry and used to generate multi-phase clock signals.

In one example, a multiplication injection locked oscillator (MIILO) circuitry includes a ring injection locked oscillator (ILO) circuitry that outputs clock signals, a first switching circuitry and a second switching circuitry. The ring ILO circuitry includes a first path having first delay stages, and a second path having second delay stages. The first switching circuitry is connected to the first path and a voltage supply node. The first switching circuitry receives a first control signal and a second control signal and selectively connects the voltage supply node to the first path based on the first control signal and the second control signal. The second switching circuitry is connected to the second path and a reference voltage node. The second switching circuitry receives the first control signal and the second control signal and selectively connects the reference voltage node to the second path based on the first control signal and the second control signal.

In one example, a clock generation circuitry includes driver circuitry and MILO circuitry. The driver circuitry receives a first clock signal and output a first control signal and a second control signal. The MILO circuitry includes ring ILO circuitry that outputs clock signals. The ring ILO circuitry includes a first path having first delay stages, and a second path having second delay stages. The MILO circuitry further includes first switching circuitry connected to the first path and a voltage supply node. The first switching circuitry receives the first control signal and the second control signal and selectively connects the first path with the voltage supply node based on the first control signal and the second control signal. Further, the MILO circuitry includes second switching circuitry connected to the second path and a reference voltage node. The second switching circuitry receives the first control signal and the second control signal and selectively connects the second path with the reference voltage node based on the first control signal and the second control signal.

In one example, a method for operating MIILO includes generating a first control signal and a second control signal from a clock signal, and receiving the first control signal and the second control signal at first switching circuitry. The first switching circuitry is connected to a first path of ring ILO circuitry and a voltage supply node. The method further includes receiving the first control signal and the second control signal at second switching circuitry. The second switching circuitry is connected to a second path of the ring ILO circuitry and a reference voltage node. Further, the method includes outputting, from the ring ILO circuitry, a plurality of clock signals based on the first control signal and the second control signal.

BRIEF DESCRIPTION OF THE DRAWINGS

So that the manner in which the above-recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

A communication system is described herein that includes clock generation circuitry that generates multi-phase clock signals having an increased frequency from that of a single phase reference clock signal. In one example, transceiver circuitry of the communication system includes multiplication injection locked oscillator (MILO) circuitry that generates multi-phase clock signals. The multi-phase clock signals are used for phase adjustment of received data signals. To reduce power, the clock signal is provided to the MILO at about half of the target frequency. For example, for a target frequency (e.g., the frequency of the multi-phase clock signals) of about 18.75 GHz, the frequency of the clock signal is about 9.375 GHz.

In high speed (e.g., at least about 200 Gbps) communication systems, delivering an injection signal having narrow pulse signal to the MILO circuitry over a long distance is power intensive and error prone. To reduce the power requirements of the communication system and errors within the multi-phase clock signals, the narrow pulse signal is generated locally within the MILO circuitry. For example, the MILO circuitry includes injection circuitry that generates the narrow pulse signal (e.g., an injection signal) based on control signals. Further, generating the narrow pulse signal locally within the MILO circuitry provides more flexibility with regard to the width of the pulse of the narrow pulse signal as compared to conventional approaches. For example, the injection circuitry generates a narrow pulse signal with sharp (e.g., about vertical) rising edges and the falling edges. Accordingly, the narrow pulse signal can have a pulse width of less than about 20 ps. In one example, narrow pulse signals generated locally within the MILO circuitry have a pulse width of about 15 ps or less. In one or more examples, a narrow pulse signal generated locally within the MILO circuitry can have a pulse width of less than or equal to about 10 ps. Such injection signals increases the injection current, widening the injection locking range of the MILO circuitry and improving the noise shaping property of the MILO circuitry.

Figure 1:
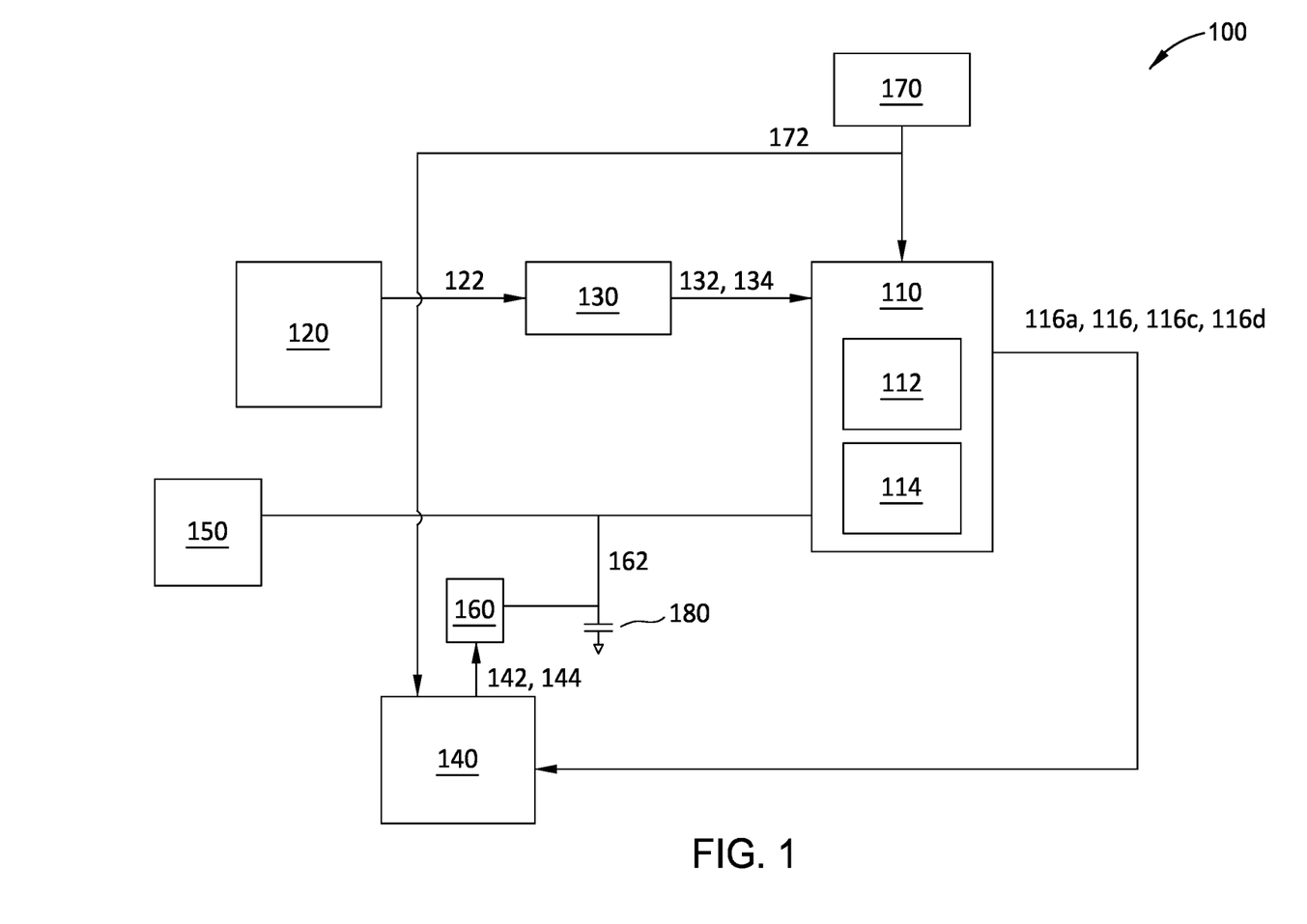
FIG. 1 is a schematic diagram of clock generation circuitry, according to an example.

FIG. 1 illustrates clock generation circuitry 100, according to one or more examples. The clock generation circuitry 100 comprises a multiplication injection locked oscillator (MILO) circuitry 110, clock circuitry 120, driver circuitry 130, quadrature phase error detector (QED) circuitry 140, control circuitry 150, voltage to current converter (V2I) circuitry 160, and power supply circuitry 170.

The clock circuitry 120 has an output connected to an input of the driver circuitry 130. In one example, the clock circuitry 120 generates a clock signal 122. The clock signal 122 has a frequency in a range of about 8 GHz to about 10 GHz. In other examples, the clock signal 122 has a frequency less than about 8 GHz or greater than about 10 GHz.

The driver circuitry 130 receives the clock signal 122 and outputs a control signal 132 and a control signal 134. In one example, the driver circuitry 130 generates the control signal 132 and the control signal 134 from the clock signal 122. As will be described in more detail in the following, the driver circuitry 130 includes a first path having a first inverters and a second path having a second inverters that generate the control signals 132 and 134, respectively. In one example, the amount of the delay of the first path is less than or greater than the amount of the delay of the second path. Accordingly, the control signal 134 is delayed with reference to the control signal 132. In another example, the first control signal 132 is delayed with reference to the control signal 134.

The MILO circuitry 110 receives the control signals 132 and 134 and outputs the clock signals 116a-116d. The clock signals 116a-116d are multi-phase clock signals. The clock signals 116a-116d have a frequency greater than the frequency of the clock signal 122. In one example, the frequency of the clock signals 116a-116d is twice that of the frequency of the clock signal 122. In other examples, the frequency of the clock signals 116a-116d is N times the frequency of the clock signal 122. N is one or more.

The MILO circuitry 110 includes ring injection locked oscillator (ILO) circuitry 112 and injection circuitry 114. The injection circuitry 114 receives the control signals 132 and 134 and controls the ring ILO circuitry 112 to generate the clock signals 116a-116d. For example, the injection circuitry 114 generates an injection signal based on the control signals 132 and 134 and outputs the control signals 132 and 134 to the ring ILO circuitry 112. The ring ILO circuitry 112 generate the clock signals 116a-116d based on the injection signal.

The phase of the clocks signals 116a-116d are separated by 90 degrees from each other. In one example, the phase of the clock signal 116a is 0 degrees, the phase of the clock signal 116b differs from the phase of the clock signal 116a by 90 degrees, the phase of the clock signal 116c differs from the phase of the clock signal 116a by 180 degrees, and the phase of the clock signal 116d differs from the phase of the clock signal 116a by 270 degrees.

The QED circuitry 140 compares two or more of the clock signals 116a-116d to determine an adjustment (or correction) value to apply to the MILO circuitry 110. The QED circuitry 124 detects the quadrature phase error between pairs of the clock signals 116a-116d that are in quadrature with each other. In one example, the phase difference is output as a control signal 142 or 144 (e.g., adjustment signals). The control signals 142 and 144 adjusts functionality of the MILO circuitry 110 to adjust the phase of one or more of the clock signals 116a-116d. Adjusting the functionality of the MILO circuitry 110 reduces phase differences between two or more of the clock signals 116a-116d.

The V2I circuitry 160 and the filter circuitry 180 averages the control signals 142 and 144 to generate the control signal 162. The control signal 162 adjusts the ring ILO circuitry to ensure that the oscillation frequency of the ring ILO circuitry is matched to N times the frequency of the clock signal 122, minimizing in-phase and quadrature error of the ring ILO circuitry.

The control circuitry 150 adjusts the frequency of the MILO circuitry 110. In one example, the control circuitry 150 provides a coarse adjustment to the MILO circuitry 110 to adjust the frequency of the MILO circuitry 110. In one example, the control circuitry 150 is connected to the MILO circuitry 110 via a switch.

The power supply circuitry 170 provides a regulated voltage signal 172 to the MILO circuitry 110 and the QED circuitry 140. In other examples, the regulated voltage signal 172 is output to one or more of the clock circuitry 120, the control circuitry 150, the V2I circuitry 160, and the driver circuitry 130. The regulated voltage signal 172 has a voltage level of about 0.9 V or less. In other example, the regulated voltage signal 172 has a voltage level of greater than about 0.9 V.

Figure 2:
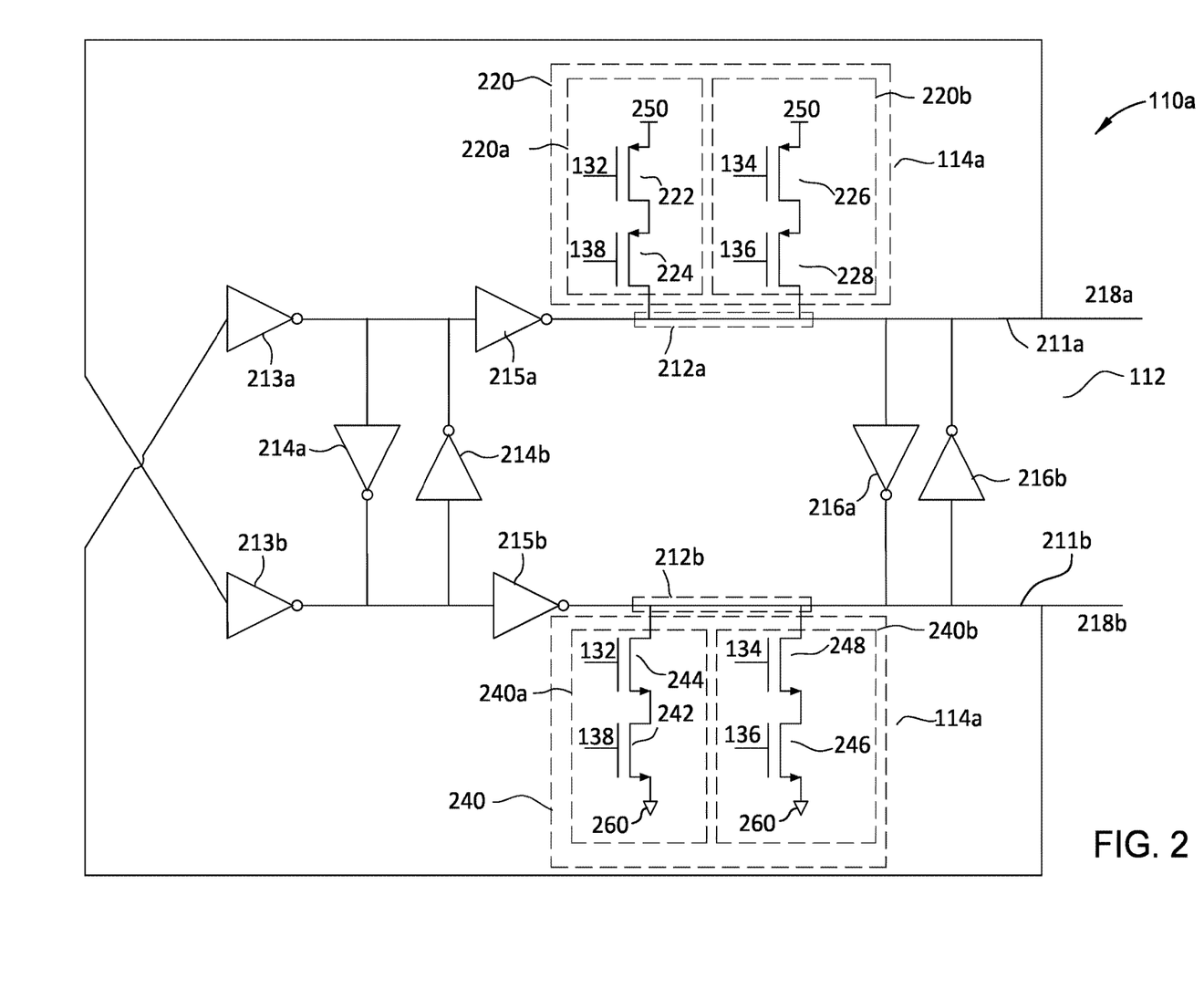
FIG. 2 is a schematic diagram of multiplication injection locked oscillator circuitry, according to an example.

FIG. 2 is a schematic illustration of MILO circuitry 110a, according to one or more examples. The MILO circuitry 110 includes the ring ILO circuitry 112 and injection circuitry 114a. The injection circuitry 114a includes switching circuitry 220 and switching circuitry 240. The switching circuitry 220 is connected to the path 211a of the ring ILO circuitry 112 and the switching circuitry 240 is connected to the path 211b of the ring ILO circuitry 112. In one example, the switching circuitry 220 is connected to the injection node 212a along the path 211a, and the switching circuitry 240 is connected to the injection node 212b along the path 211b.

The switching circuitry 220 is connected to the path 211a and to a voltage supply node 250. A first power supply signal is provided via the voltage supply node 250. For example, the power supply circuitry 170 outputs the voltage signal (e.g., power supply signal) 172 to the voltage supply node 250. The switching circuitry 220 receives the control signals 132-136. The control signal 132 and 136 are complementary signals, and the control signals 134 and 138 are complementary signals. The control signals 136 and 138 are generated from the control signals 132 and 134. In one example, the control signals 136 and 138 are generated within the MILO circuitry 110a or external to the MILO circuitry 110a. The switching circuitry 220 selectively connects the injection node 212a along the path 211a to the voltage supply node 250 based on the control signals 132-138.

The switching circuitry 220 includes switch 220a and switch 220b. The switch 220a includes transistors 222 and 224 and the switch 220b includes transistors 226 and 228. The transistors 222, 224, 226, and 228 are n-type (NMOS) transistors. In other examples, one or more of the transistors 222, 224, 226, and 228 is a p-type (PMOS) transistor.

The transistors 222 and 224 are connected in series with each other between the voltage supply node 250 and the injection node 212a. The source of the transistor 222 is connected to the voltage supply node 250. The drain of the transistor 222 is connected to the source of the transistor 224. The drain of the transistor 224 is connected to the injection node 212a and the path 211a. A gate of the transistor 222 receives the control signal 132 and a gate of the transistor 224 receives the control signal 134.

The transistors 226 and 228 are connected in series with each other between the voltage supply node 250 and the injection node 212a. The source of the transistor 226 is connected to the voltage supply node 250. The drain of the transistor 226 is connected to the source of the transistor 228. The drain of the transistor 228 is connected to the injection node 212a and the path 211a. A gate of the transistor 226 receives the control signal 134 and a gate of the transistor 228 receives the control signal 132.

The switches 220a and 220b are in an "on" state (e.g., in a closed position) and connect the injection node 212a with the voltage supply node 250 based on one of the control signals 132 and 134 having a high voltage value and one of the controls signals 132 and 134 having a low voltage value. Further, the switches 220a and 220b are in an "off" state (e.g., in an opened position) and disconnect the injection node 212a from the voltage supply node 250 based on both of the control signals 132 and 134 having a high voltage value or a low voltage value.

In one example, based on the control signal 132 having a high voltage value and the control signal 134 having a low voltage value, the switch 220a is in an "on" state and the switch 220b is an "off" state. Based on the control signal 132 having a low voltage value and the control signal 134 having a high voltage value, the switch 220b is in an "on" state and the switch 220a is an "off" state. Further, based on the control signals 132 and 134 both having a low voltage value or a high voltage value, the switches 220a and 220b are in an "off" state.

The switching circuitry 240 is connected to the path 211b and to a reference voltage node 260. The switching circuitry 240 receives the control signals 132-138. The switching circuitry 240 includes switch 240a and switch 240b. The switch 240a includes transistors 242 and 244 and the switch 240b includes transistors 246 and 248. The transistors 244-248 are PMOS transistors. The switching circuitry 240 selectively connects the injection node 212b along the path 211b to the reference voltage node 260 based on the control signals 132-138.

The transistors 242 and 244 are connected in series with each other between the reference voltage node 260 and the injection node 212b. The source of the transistor 242 is connected to the reference voltage node 260. The drain of the transistor 242 is connected to the source of the transistor 244. The drain of the transistor 244 is connected to the injection node 212b and the path 211b. A gate of the transistor 242 receives the control signal 132 and a gate of the transistor 244 receives the control signal 138.

The transistors 246 and 248 are connected in series with each other between the reference voltage node 260 and the injection node 212b. The source of the transistor 246 is connected to the reference voltage node 260. The drain of the transistor 246 is connected to the source of the transistor 248. The drain of the transistor 248 is connected to the injection node 212b and the path 211b. A gate of the transistor 246 receives the control signal 136 and a gate of the transistor 248 receives the control signal 134.

The switches 240a and 240b are in an "on" state (e.g., in a closed position) and connect the injection node 212ab with the reference voltage node 260 based on one of the control signals 132 and 134 having a high voltage value and one of the controls signals 132 and 134 having a low voltage value. Further, the switches 240a and 240b are in an "off" state (e.g., in an opened position) and disconnect the injection node 212b from the reference voltage node 260 based on both of the control signals 132 and 134 having a high voltage value or a low voltage value.

In one example, based on the control signal 132 having a high voltage value and the control signal 134 having a low voltage value, the switch 240b is in an "on" state and the switch 240a is an "off" state. Based on the control signal 132 having a low voltage value and the control signal 134 having a high voltage value, the switch 240a is in an "on" state and the switch 240b is an "off" state. Further, based on the control signals 132 and 134 both having a low voltage value or a high voltage value, the switches 240a and 240b are in an "off" state.

Figure 5:
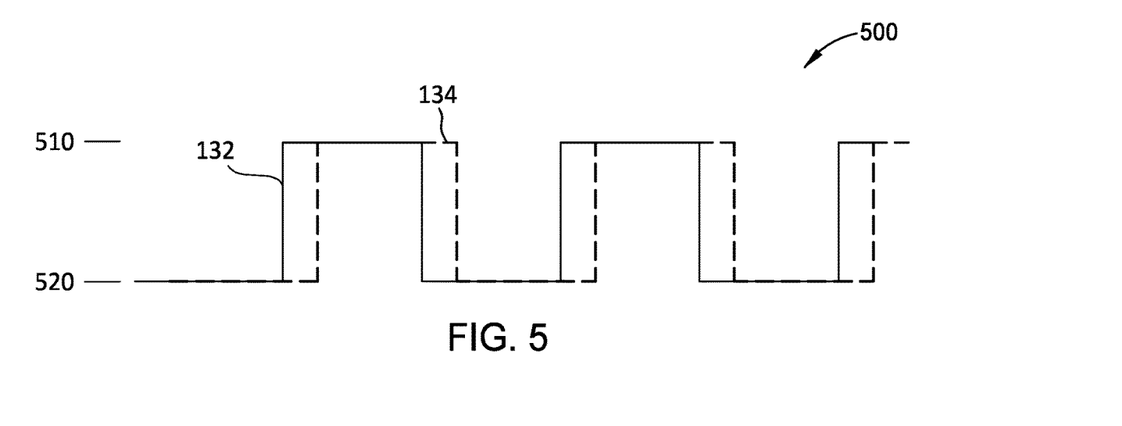
FIG. 5 illustrates the waveforms of a first and second control signal, according to an example.
Figure 6:
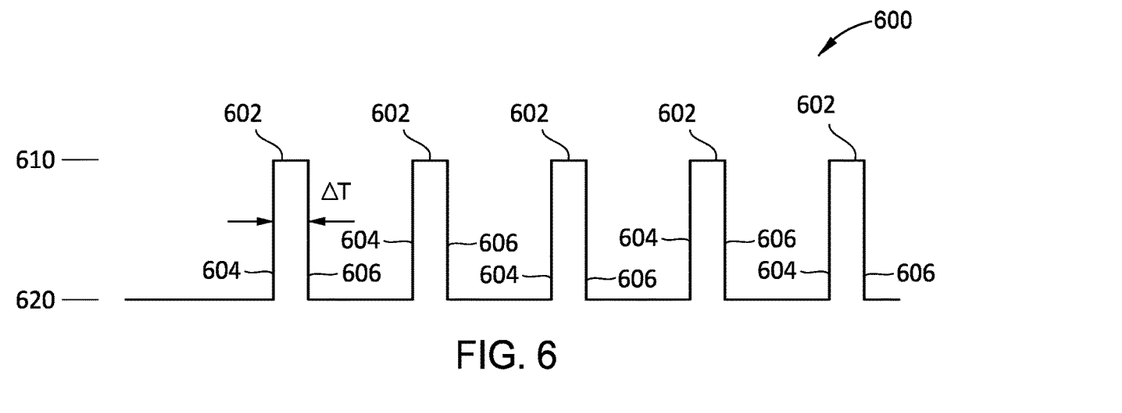
FIG. 6 illustrates a waveform of a narrowband pulse waveform, according to an example.

FIG. 5 and FIG. 6 illustrate the control signals 132 and 134, and the corresponding current signal 600 (e.g., injection signal or narrow pulse signal), respectively. In one example, as can be seen in FIG. 5 and FIG. 6, controlling the state of the switches 220a, 220b, 240a, and 240b based on control signals 132 and 134, generates the current signal 600. For example, the current signal 600 includes pulses 602. During each pulse, one of the switches 220a and 220b and one of the switches 240a and 240b are in the on state such that the corresponding the injection nodes 212a and 212b are connected to the voltage supply node 250 and the reference voltage node 260. Further, between each pulse 602, all of the switches 220a, 220b, 240a, and 240b are in an off state, and the injection nodes 212a and 212b are disconnected to the voltage supply node 250 and the reference voltage node 260. FIG. 5 and FIG. 6 are described in greater detail in the following.

The ring ILO circuitry 112 generates the clock signals 116a-116d based on the current injected (e.g., the injection signal) at the injection nodes 212a and 212b. FIG. 6 illustrates an example waveform of the current signal 600 that is injected at the injection nodes 212a and 212b based on the control signals 132 and 134. The current signal 600 is generated by the switching circuitries 220 and 240 from the control signals 132 and 134.

The ring ILO circuitry 112 includes inverters 213, 215 and cross-coupled inverters 214 and 216. In other examples, the ring ILO circuitry includes additional inverters and/or additional cross-coupled inverters not illustrated in FIG. 2. A quadrature pair of the clock signals 116a-116d is output via the outputs 218a and 218b, respectively. In other example, the ring ILO circuitry 112 includes additional stages that output corresponding quadrature pairs of the clock signals 116a-116d.

The ILO circuitry 112 oscillates at a natural frequency (fo) based on inverters 213, 215, 214 and 216. In one or more examples, the ILO circuitry 112 is pulled to oscillate at the harmonics (N) of an injection frequency (finj) of an injection signal instead the fo based on the injection signal. Operating at the injection frequency may be referred to as achieving injection lock. The ease at which the injection lock is achieved corresponds to size the power of the N*finj harmonic. Increasing the N*finj harmonic increase the ease at which injection lock is obtained. In one example, N=2. A narrow pulse at the injection increases the spectral power of second harmonics (2*finj) so the ring oscillator will be locked to 2*finj instead of fo.

Figure 3:
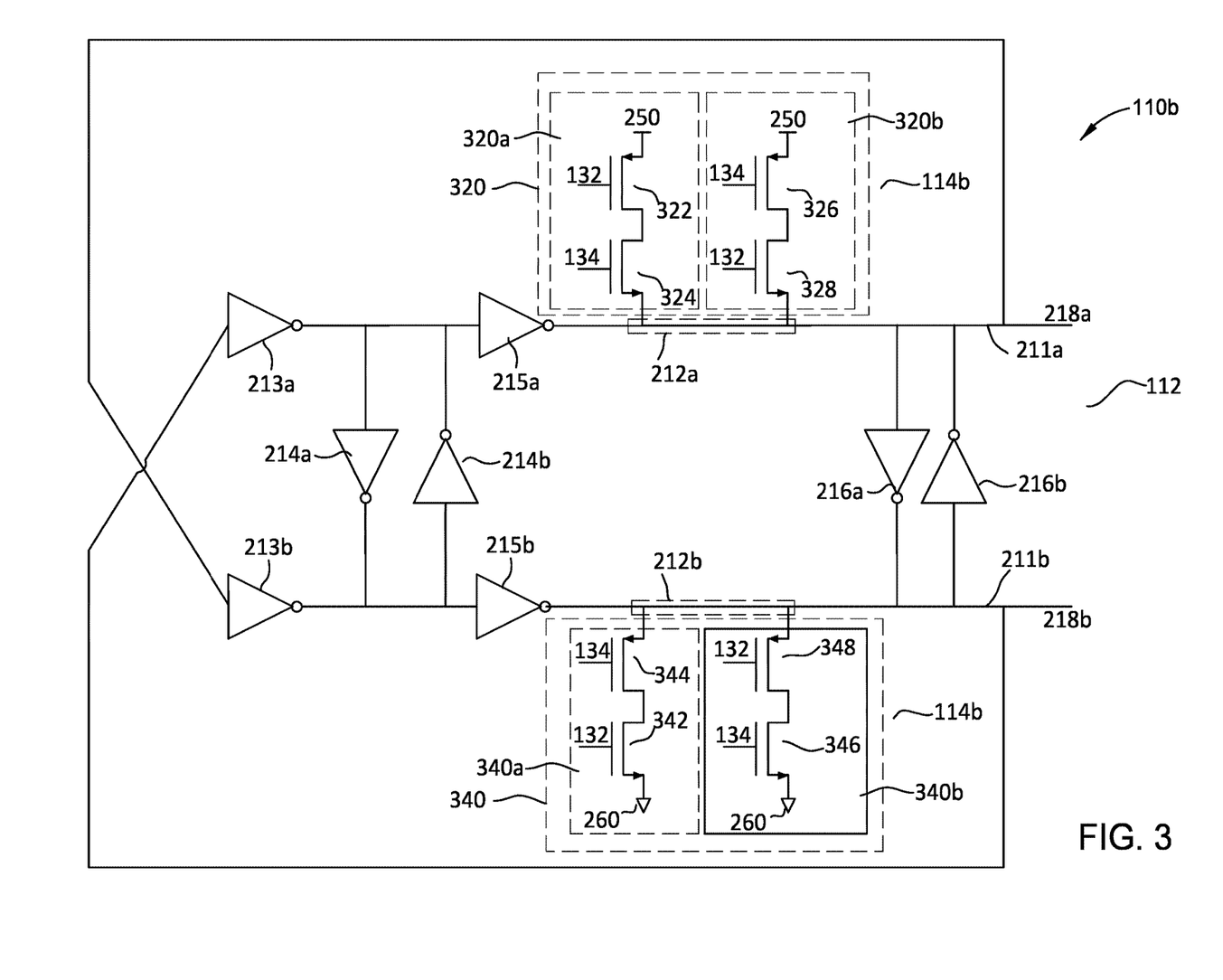
FIG. 3 is a schematic diagram of multiplication injection locked oscillator circuitry, according to an example.

FIG. 3 is a schematic illustration of MILO circuitry 110b. The MILO circuitry 110b includes the ring ILO circuitry 112 and the injection circuitry 114b. The injection circuitry 114b includes switching circuitries 320 and 340. The switching circuitries 320 and 340 are configured similar to the switching circuitries 220 and 240 of FIG. 2. For example, the switching circuitry 220 and the switching circuitry 320 are connected between the voltage supply node 250 and the injection node 212a, and the switching circuitry 240 and the switching circuitry 340 are connected between the reference voltage node 260 and the injection node 212b. The switching circuitries 320 and 340 differ from the switching circuitries 220 and 240 in that the switching circuitries 320 and 340 include both NMOS and PMOS transistors. Further, the switching circuitries 320 and 340 receive and are controlled via the control signals 132 and 134 and do not receive the control signals 136 and 138.

The switching circuitry 330 is connected to the path 211a and to a voltage supply node 250. The switching circuitry 330 receives the control signals 132 and 134. The switching circuitry 330 includes switch 320a and switch 320b. The switch 320a includes transistors 322 and 324 and the switch 320b includes transistors 326 and 328. The transistors 322 and 326 are NMOS and the transistors 324 and 324 are PMOS transistors. In one example, the switching circuitry 320 selectively connects the injection node 212a along the path 211a to the voltage supply node 250 based on the control signals 132 and 134.

The transistors 322 and 324 are connected in series with each other between the voltage supply node 250 and the injection node 212a. The source of the transistor 322 is connected to the voltage supply node 250. The drain of the transistor 322 is connected to the drain of the transistor 324.

The source of the transistor 324 is connected to the injection node 212a and the path 211a. A gate of the transistor 322 receives the control signal 132 and a gate of the transistor 324 receives the control signal 134.

The transistors 326 and 328 are connected in series with each other between the voltage supply node 250 and the injection node 212a. The source of the transistor 326 is connected to the voltage supply node 250. The drain of the transistor 326 is connected to the drain of the transistor 328. The source of the transistor 328 is connected to the injection node 212a and the path 211a. A gate of the transistor 326 receives the control signal 134 and a gate of the transistor 328 receives the control signal 132.

The switches 320a and 320b are in an "on" state (e.g., in a closed position) and connect the injection node 212a with the voltage supply node 250 based on one of the control signals 132 and 134 having a high voltage value and one of the controls signals 132 and 134 having a low voltage value. Further, the switches 320a and 320b are in an "off" state (e.g., in an opened position) and disconnect the injection node 212a from the voltage supply node 250 based on both of the control signals 132 and 134 having a high voltage value or a low voltage value.

In one example, based on the control signal 132 having a high voltage value and the control signal 134 having a low voltage value, the switch 320a is in an "on" state and the switch 320b is an "off" state. Based on the control signal 132 having a low voltage value and the control signal 134 having a high voltage value, the switch 320b is in an "on" state and the switch 320a is an "off" state. Further, based on the control signals 132 and 134 both having a low voltage value or a high voltage value, the switches 320a and 320b are in an "off" state.

The switching circuitry 340 is connected to the path 211b and to a reference voltage node 260. The switching circuitry 340 receives the control signals 132 and 134. The switching circuitry 340 includes switch 340a and switch 340b. The switch 340a includes transistors 342 and 344 and the switch 340b includes transistors 346 and 348. The transistors 344 and 348 are NMOS and the transistors 342 and 3346 are PMOS transistors. In one example, the switching circuitry 340 selectively connects the injection node 212b along the path 211b to the reference voltage node 260 based on the control signals 132 and 134.

The transistors 342 and 344 are connected in series with each other between the reference voltage node 260 and the injection node 212b. The source of the transistor 342 is connected to the reference voltage node 260. The drain of the transistor 342 is connected to the drain of the transistor 344. The source of the transistor 344 is connected to the injection node 212b and the path 211b. A gate of the transistor 342 receives the control signal 132 and a gate of the transistor 344 receives the control signal 134.

The transistors 346 and 348 are connected in series with each other between the reference voltage node 260 and the injection node 212b. The source of the transistor 346 is connected to the reference voltage node 260. The drain of the transistor 346 is connected to the drain of the transistor 348. The source of the transistor 348 is connected to the injection node 212b and the path 211b. A gate of the transistor 346 receives the control signal 134 and a gate of the transistor 348 receives the control signal 132.

The switches 340a and 340b are in an "on" state (e.g., in a closed position) and connect the injection node 212ab with the reference voltage node 260 based on one of the control signals 132 and 134 having a high voltage value and one of the controls signals 132 and 134 having a low voltage value.

Further, the switches 340a and 340b are in an "off" state (e.g., in an opened position) and disconnect the injection node 212b from the reference voltage node 260 based on both of the control signals 132 and 134 having a high voltage value or a low voltage value.

In one example, based on the control signal 132 having a high voltage value and the control signal 134 having a low voltage value, the switch 340a is in an "on" state and the switch 340b is an "off" state. Based on the control signal 132 having a low voltage value and the control signal 134 having a high voltage value, the switch 340b is in an "on" state and the switch 340a is an "off" state. Further, based on the control signals 132 and 134 both having a low voltage value or a high voltage value, the switches 340a and 340b are in an "off" state.

As is noted above, the ring ILO circuitry 112 generates the clock signals 116a-116d based on the current injected at the injection nodes 212a and 212b. FIG. 6 illustrates an example waveform of the current signal 600 that is injected at the injection nodes 212a and 212b. The current signal 600 is generated by the switching circuitries 220 and 240 from the control signals 132 and 134.

In one or more examples, one of the switching circuitries (e.g., the switching circuitries 220 or 240, or the switching circuitries 320 or 340) is disabled when the duty cycle of the clock signal 122 is less than a threshold. The threshold corresponds to as duty cycle where both rising and falling edges of the clock signal 122 may be used by the MILO circuitry 110 for clock signal generation. When a switching circuitry is disabled, the MILO circuitry 110 is enabled to perform signal edge injection as the rising or falling edge of the clock signal 122 is used to generate the clock signals 116a-116d.

Figure 4:
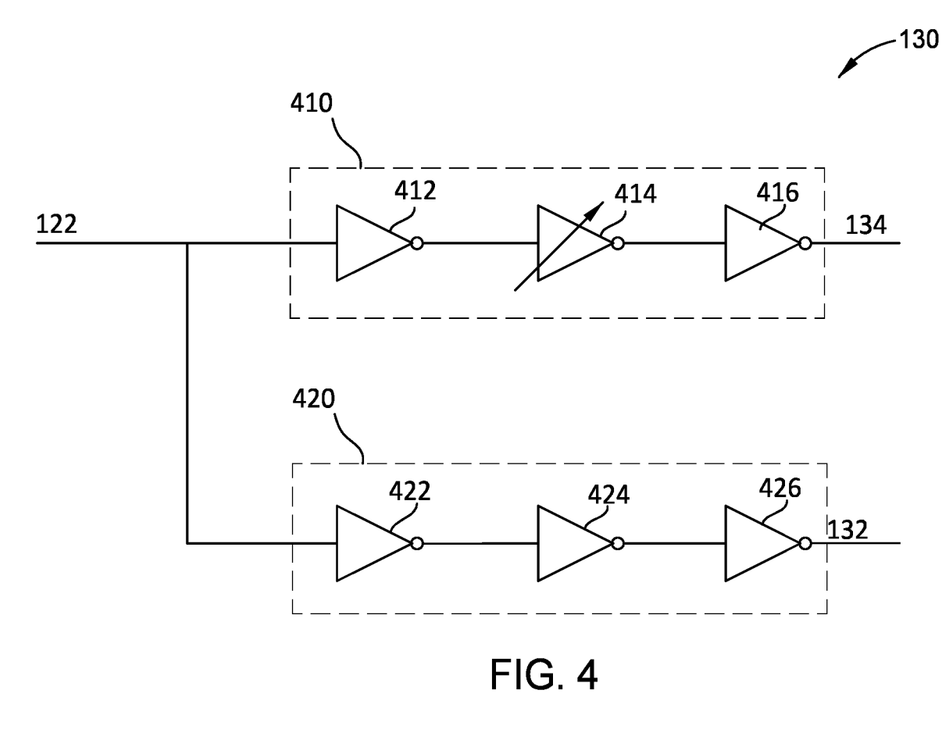
FIG. 4 is a schematic diagram of driver circuitry, according to an example.

FIG. 4 is a schematic illustration of the driver circuitry 130, according to one or more examples. The driver circuitry 130 receives the clock signal 122 and generates the control signal 132 and 134. The driver circuitry 130 includes path 410 (e.g., delay path) and path 420 (e.g., delay path). The path 410 delays the clock signal 122 to generate the control signal 134. The path 410 includes one or more inverters. For example, the path 410 includes inverters 412, 414, and 416. In other examples, the path 410 includes a tunable inverter. For example, the inverter 414 is tunable to adjust the delay of the inverter 414 and the path 410. The path 420 delays the clock signal 122 to generate the control signal 132. The path 420 includes one or more inverters. For example, the path 410 includes inverters 412, 414, and 416. The delay of the path 410 is greater than the delay of the path 420. Accordingly, the control signal 134 is delayed with respect to the control signal 132.

In one example, the control signals 132 and 134 are further inverted to generate the complementary control signals 136 and 138. The driver circuitry 130 may generate the control signals 136 and 138 or the control signals 136 and 138 are generated outside the driver circuitry 130.

FIG. 5 illustrates a graph 500 of the control signals 132 and 134. As illustrated by FIG. 5, the control signal 134 is delayed as compared to the control signal 132. The control signals 132 and 134 have a similar frequency. In one example, the frequency of the control signals 132 and 134 is the same as the frequency of the clock signal 122. As the control signal 134 is delayed with respect to the control signal 132, the control signals 132 and 134 transition to a high voltage value 510 at different times and to the low voltage value 520 at different times. Accordingly, the states of the switching circuitries 220, 240, 320, and 340 are controlled to generate the current signal 600 of FIG. 6. The current signal 600 transitions between the voltage levels 610 and 620 to form the pulses 602. The width of the peaks is ΔT. The width ΔT corresponds to the delay between the control signal 132 and 134. In one example, ΔT is less than about 20 ps. In another example, ΔT is less than about 15 ps. In one example, ΔT is less than about 10 ps. The rising edges 604 and falling edges 606 of the current signal 600 are about vertical. In other examples, the rising edges 604 and falling edges 606 of the current signal 600 have an undefined slope. In one or more examples, the rising edges 604 and falling edges 606 of the current signal 600 are close to, but less than, vertical.

Figure 7:
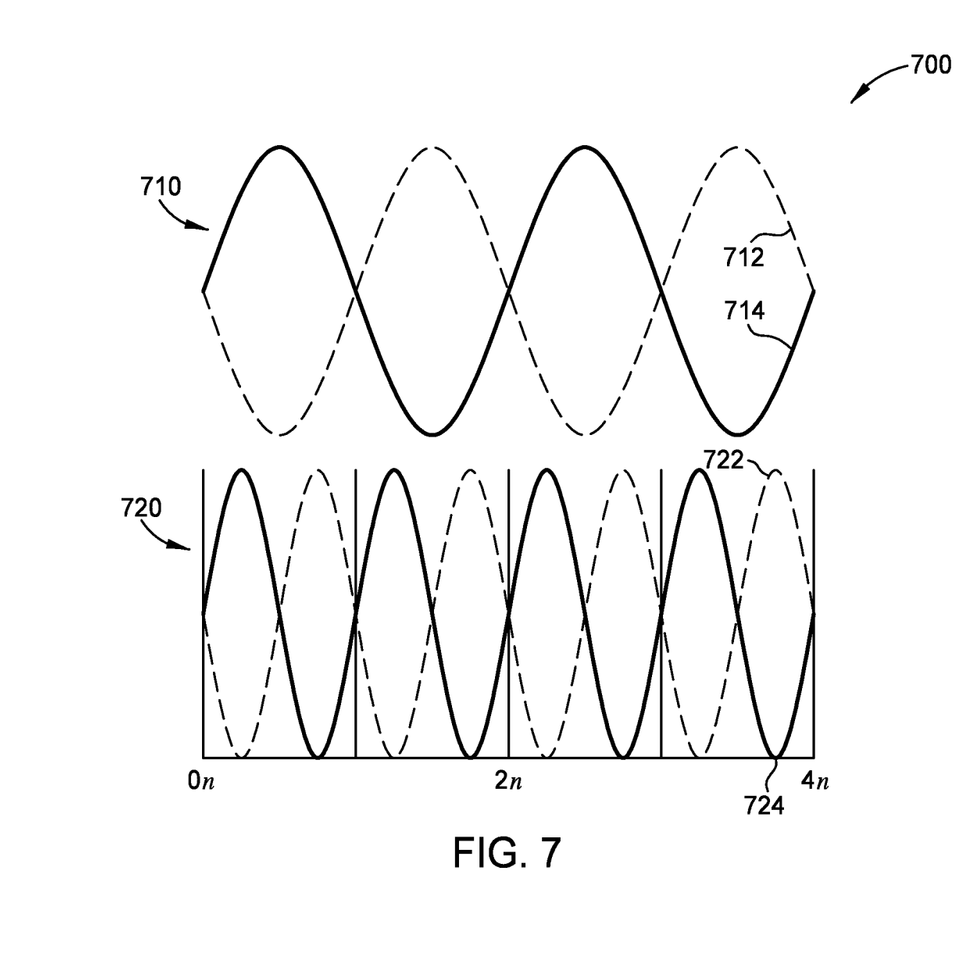
FIG. 7 illustrates graphs of current signals and clock signals having an increased frequency, according to an example.

FIG. 7 illustrates graphs 710 and 720, according to one or more examples. The graph 710 illustrates the signals 712 and 714. The signals 712 and 714 correspond to the current injected at the injection nodes (e.g., injection nodes 212a and 212b) of a ring ILO circuitry (e.g., the ring ILO circuitry 212). The graph 720 illustrates the signals 722 and 724. The signals 722 and 724 are signals (e.g., clock signals) output from a ring ILO circuitry (e.g., the ring ILO circuitry 112). As is illustrated by the graphs 710 and 720, the frequencies of the signals 722 and 724 are twice that of the frequency of the signals 722 and 724.

In one or more examples, signals 712 and 714 represent the fundamental tone of the injection signal (finj) of the ring ILO circuitry 212. The signals 722 and 724 represent the fundamental tone of the output clock which is 2*finj. The narrow injection pulse 730 is provided to the ring ILO circuitry 212 as the injection signal. The narrow injection pulse is spaced at a time interval of 1/(2*finj).

Figure 8:
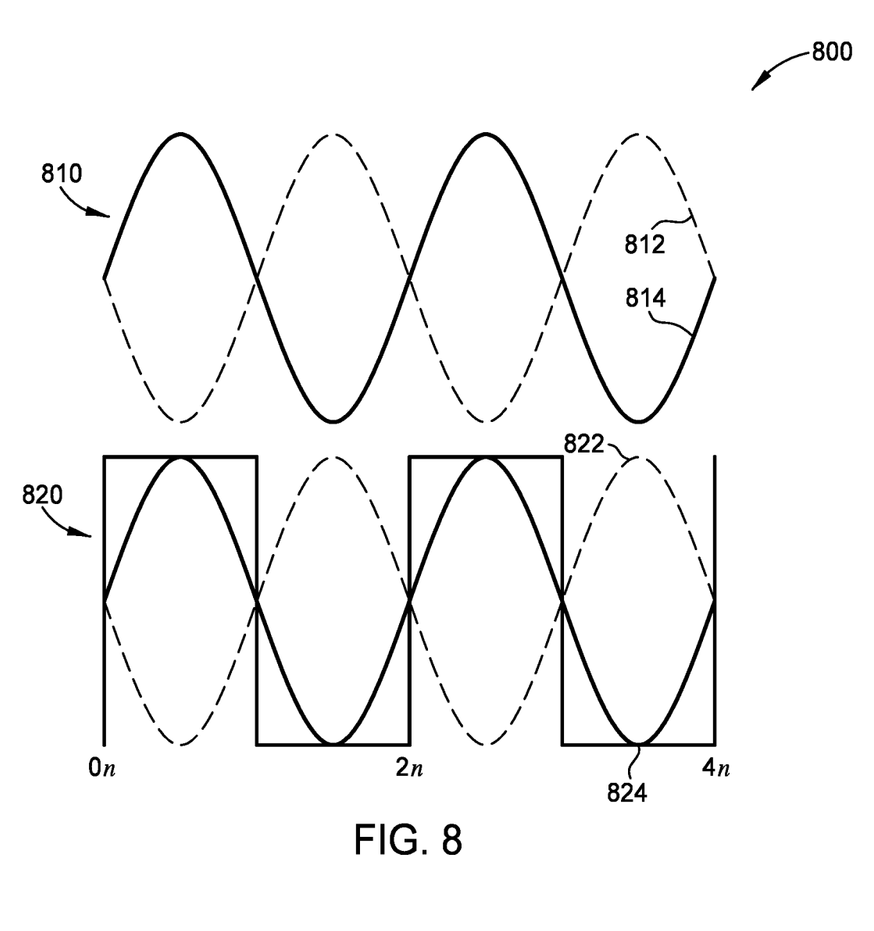
FIG. 8 illustrates graphs of current signals and clock signals having the same frequency, according to an example.

FIG. 8 illustrates graphs 810 and 820, according to one or more examples. The graph 810 illustrates the signals 812 and 814. The signals 812 and 814 correspond to the current injected at the injection nodes (e.g., injection nodes 212a and 212b) of a ring ILO circuitry (e.g., the ring ILO circuitry 212). The graph 820 illustrates the signals 822 and 824. The signals 822 and 824 are signals (e.g., clock signals) output from a ring ILO circuitry (e.g., the ring ILO circuitry 112). As is illustrated by the graphs 810 and 820, the frequencies of the signals 822 and 824 are the same as the frequencies of the signals 812 and 814. Accordingly, the frequencies of the signals 822 and 824 are not increased with reference to clock signal 122. In FIG. 8, the ring ILO circuitry 212 is locked at N*finj where N=1. The example of FIG. 8 may be used in applications where multiple phases are needed from a single phase clock source at the same frequency.

Figure 9:
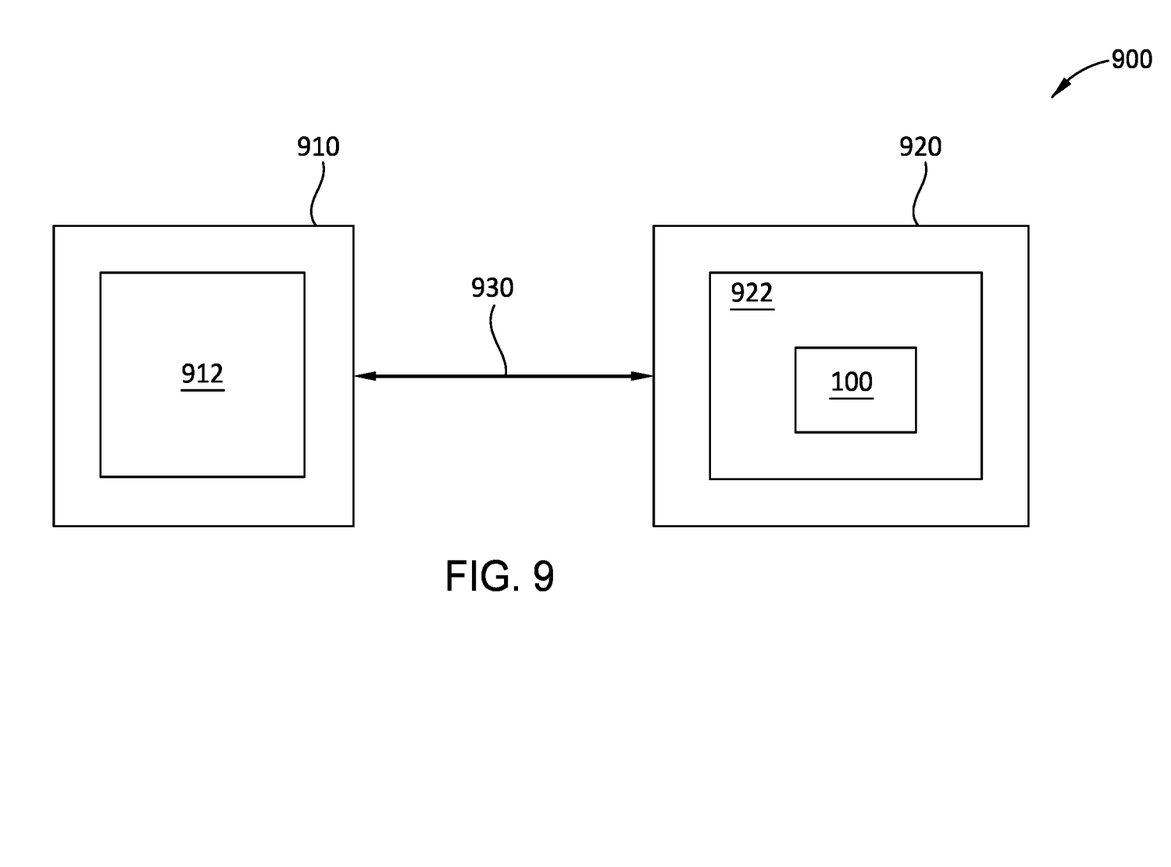
FIG. 9 illustrates a schematic block diagram of a communication system, according to an example.

FIG. 9 illustrates a schematic block diagram of a communication system 900, according to one or more examples. The communication system 900 includes transceiver circuitry 910 and transceiver circuitry 920. The transceiver circuitry 910 may be serializer-deserializer (SerDes) circuitry. The transceiver circuitry 910 includes transmitter circuitry 912. While not illustrated, the transceiver circuitry 910 further includes receiver circuitry and control circuitry. The transceiver circuitry 920 includes receiver circuitry 922. The receiver circuitry 922 includes clock generation circuitry 100. The clock generation circuitry 100 may be part of a phase interpolator (PI) circuitry of the receiver circuitry 922. While not illustrated, the transceiver circuitry 920 additionally includes transmitter circuitry and control circuitry. In one example, the clock generation circuitry 100 generates clock signals 116a-116d which are used by the receiver circuitry 922 in receiving and processing a data signal received over the communication channel 930 from the transmitter circuitry 912. In one example, the transceiver circuitry 910 further includes clock generation circuitry configured similar to that of the clock generation circuitry 100.

The transceiver circuitry 910 is communicatively coupled to the transceiver circuitry 920 via the communication channel 930. In one example, the transmitter circuitry 912 is communicatively coupled to the receiver circuitry 922 via the communication channel 930. The transmitter circuitry 912 communicates data to the receiver circuitry 922 via the communication channel 930. The communication channel 930 is a high speed communication channel. For example, the communication channel 930 supports a communication speed of at least about 100 Gbps, 200 Gbps, or more. Further, the transmitter circuitry 912 outputs a reference clock to the receiver circuitry 922. For example, the transmitter circuitry 912 outputs the reference clock signal CLKI to the receiver circuitry 922.

Figure 10:
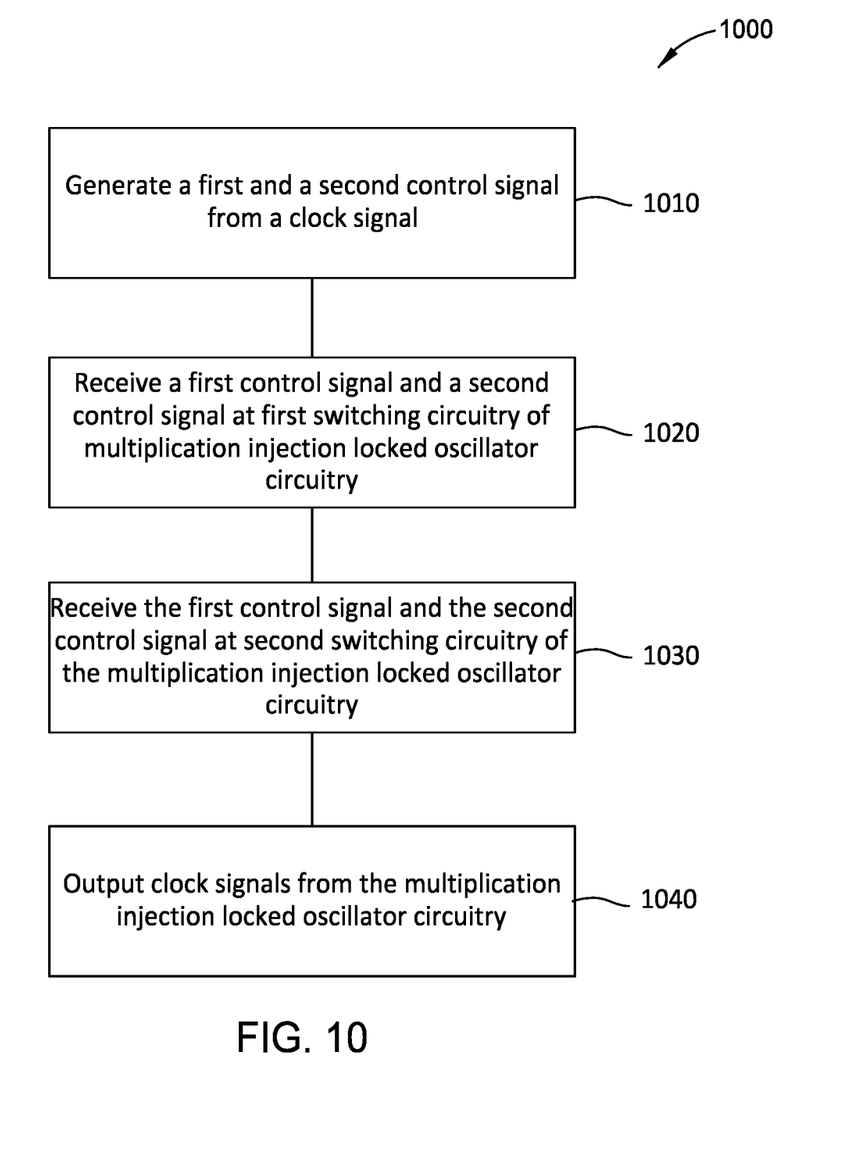
FIG. 10 is a flowchart of a method for operating multiplication injection locked oscillator circuitry, according to an example.

FIG. 10 illustrates a flowchart of a method 1000 for operating MILO circuitry (e.g., the MILO circuitry 110), according to one or more examples. At block 1010, first and second control signals are generated from a clock signal. For example, with reference to FIG. 1, the clock circuitry 120 generates the clock signal 122. The driver circuitry 130 receives the clock signal and generates the control signals 132 and 134 from the clock signal 122. The control signal 134 is delayed with reference to the control signal 132.

At block 1010, the first control signal and the second control signal are received at first switching circuitry of MILO circuitry. For example, with reference to FIG. 3, the control signals 132 and 134 are received at the switching circuitry 320. At block 1020, the first control signal and the second control signal are received at second switching circuitry of the MILO circuitry.

With reference to FIG. 3, the control signals 132 and 134 are received at the switching circuitry 340. In one example, during a first period, the control signal 132 has a high voltage level and the control signal 134 has a low voltage level, and the switches 320a and 340a are turned on and the switches 320b and 340b are turned off. Accordingly, the voltage supply node 250 is connected to the injection node 212a of the path 211a, and the reference voltage node 260 is connected to the injection node 212b of the path 211b.

During a second period, the control signal 132 and the control signal 134 have a high voltage level, and the switches 320a and 340a and the switches 320b and 340b are turned off. Accordingly, the voltage supply node 250 is disconnected from the injection node 212a of the path 211a, and the reference voltage node 260 is disconnected to the injection node 212b of the path 211b. Between the beginning of first period and the beginning of the second period, a first pulse (e.g., a first pulse 602 of the current signal 600) of a current signal (e.g., narrow pulse signal) is generated.

During a third period, the control signal 132 has a low voltage level and the control signal 134 has a high voltage level, and the switches 320a and 340a are turned off and the switches 320b and 340b are turned on. Accordingly, the voltage supply node 250 is connected to the injection node 212a of the path 211a, and the reference voltage node 260 is connected to the injection node 212b of the path 211b.

During a fourth period, the control signal 132 and the control signal 134 have a low voltage level, and the switches 320a and 340a and the switches 320b and 340b are turned off. Accordingly, the voltage supply node 250 is disconnected from the injection node 212a of the path 211a, and the reference voltage node 260 is disconnected to the injection node 212b of the path 211b. Between the beginning of third period and the beginning of the fourth period, a second pulse (e.g., a second pulse 602 of the current signal 600) of the current signal (e.g., narrow pulse signal) is generated.

At block 1040, clock signals are output from the MILO circuitry. For example, with reference to FIG. 1, the clock signals 116a-116d are generated by the MILO circuitry 110. The clock signals 116a-116d are generated based on the control signal 132 and the control signal 134. In one example, the frequency of the clock signals 116a-116d is N times the frequency of the clock signal 122. N is one or more.

Thus, a MILO circuitry that locally generates a narrow pulse signal to reduce power requirements of the corresponding communication system as has been described above. The MILO circuitry includes injection circuitry that is connected to injection nodes of ring ILO circuitry. The injection circuitry generates and outputs a narrow pulse signal to the injection nodes based on control signals generated from a clock signal. The injection circuitry includes switching circuitries that are controlled by the voltage levels of the control signals to generate the narrow pulse signal which is injected into the ring ILO circuitry and used to generate multi-phase clock signals.

While the foregoing is directed to specific examples, other and further examples may be devised without departing from the basic scope thereof, and the scope thereof is determined by the claims that follow.

What is claimed is:

1. A multiplication injection locked oscillator (MIILO) circuitry comprising:
   ring injection locked oscillator (ILO) circuitry configured to output clock signals, the ring ILO circuitry comprising:
   a first path comprising first delay stages; and
   a second path comprising second delay stages; and
   first switching circuitry comprising a first transistor connected to a voltage supply node, a second transistor connected in series with the first transistor and to the first path, a third transistor connected to the voltage supply node, and a fourth transistor connected in series with the third transistor and to the first path, the first switching circuitry configured to receive a first control signal and a second control signal and selectively connect the voltage supply node to the first path based on the first control signal and the second control signal generating a first current signal comprising pulses, wherein a width of the pulses corresponds to a delay between the first control signal and the second control signal; and
   second switching circuitry connected to the second path and a reference voltage node, the second switching circuitry configured to receive the first control signal and the second control signal and selectively connect the reference voltage node to the second path based on the first control signal and the second control signal.

2. The MILO circuitry of claim 1, wherein a gate of the first transistor is configured to receive the first control signal, a gate of the second transistor is configured to receive the second control signal, a gate of the third transistor is configured to receive the second control signal, and a gate of the fourth transistor is configured to receive the first control signal.

3. The MILO circuitry of claim 1, wherein the second switching circuitry comprises:
   a fifth transistor connected to the reference voltage node;
   a sixth transistor connected in series with the fifth transistor and to the second path;

a seventh transistor connected to the reference voltage node; and an eighth transistor connected in series with the seventh transistor and to the second path.

4. The MILO circuitry of claim 3, wherein a gate of the fifth transistor is configured to receive the first control signal, a gate of the sixth transistor is configured to receive the second control signal, a gate of the seventh transistor is configured to receive the second control signal, and a gate of the eighth transistor is configured to receive the first control signal.

5. The MILO circuitry of claim 1, wherein the first control signal and the second control signal are generated by driver circuitry based on a first clock signal.

6. The MILO circuitry of claim 5, wherein the driver circuitry comprises:

a first delay path configured to generate the first control signal based on the first clock signal; and a second delay path configured to generate the second control signal based on the first clock signal, the second delay path comprising an adjustable delay.

7. The MILO circuitry of claim 1, wherein the second control signal is delayed with reference to the first control signal.

8. A clock generation circuitry comprising:

driver circuitry configured to receive a first clock signal and output a first control signal and a second control signal; and multiplication injection locked oscillator (MIILO) circuitry comprising:

ring injection locked oscillator (ILO) circuitry configured to output clock signals, the ring ILO circuitry comprising:

a first path comprising first delay stages; and a second path comprising second delay stages;

first switching circuitry comprising a first transistor connected to a voltage supply node, a second transistor connected in series with the first transistor and to the first path, a third transistor connected to the voltage supply node, and a fourth transistor connected in series with the third transistor and to the first path, the first switching circuitry configured to receive the first control signal and the second control signal and selectively connect the first path with the voltage supply node based on the first control signal and the second control signal generating a first current signal comprising pulses, wherein a width of the pulses corresponds to a delay between the first control signal and the second control signal; and second switching circuitry connected to the second path and a reference voltage node, the second switching circuitry configured to receive the first control signal and the second control signal and selectively connect the second path with the reference voltage node based on the first control signal and the second control signal.

9. The clock generation circuitry of claim 8, wherein a gate of the first transistor is configured to receive the first control signal, a gate of the second transistor is configured to receive the second control signal, a gate of the third transistor is configured to receive the second control signal, and a gate of the fourth transistor is configured to receive the first control signal.

10. The clock generation circuitry of claim 8, wherein the second switching circuitry comprises:

a fifth transistor connected to the reference voltage node;

a sixth transistor connected in series with the fifth transistor and to the second path;

a seventh transistor connected to the reference voltage node; and an eighth transistor connected in series with the seventh transistor and to the second path.

11. The clock generation circuitry of claim 10, wherein a gate of the fifth transistor is configured to receive the first control signal, a gate of the sixth transistor is configured to receive the second control signal, a gate of the seventh transistor is configured to receive the second control signal, and a gate of the eighth transistor is configured to receive the first control signal.

12. The clock generation circuitry of claim 8, wherein the driver circuitry comprises:

a first delay path configured to generate the first control signal based on the first clock signal; and a second delay path configured to generate the second control signal based on the first clock signal, the second delay path comprising an adjustable delay.

13. The clock generation circuitry of claim 8, wherein the second control signal is delayed with reference to the first control signal.

14. A method for operating a multiplication injection locked oscillator (MIILO) circuitry, the method comprising:

generating a first control signal and a second control signal from a clock signal;

receiving the first control signal and the second control signal at first switching circuitry, wherein the first switching circuitry comprises a first transistor connected to a voltage supply node, a second transistor connected in series with the first transistor and to a first path of ring injection locked oscillator (ILO) circuitry, a third transistor connected to the and a voltage supply node, and a fourth transistor connected in series with the third transistor and to the first path, wherein a first current signal is generated based on the first control signal and the second control signal at the first switching circuitry, the first current signal comprise pulses, and wherein a width of the pulses corresponds to a delay between the first control signal and the second control signal;

receiving the first control signal and the second control signal at second switching circuitry, wherein the second switching circuitry is connected to a second path of the ring ILO circuitry and a reference voltage node; and outputting, from the ring ILO circuitry, a plurality of clock signals based on the first control signal and the second control signal.

15. The method of claim 14 further comprising:

selectively connecting, via the first switching circuitry, the first path with the voltage supply node based on the first control signal and the second control signal; and selectively connecting, via the second switching circuitry, the second path with the reference voltage node based on the first control signal and the second control signal.

16. The method of claim 14, wherein receiving the first control signal and the second control signal at the first switching circuitry comprises:

receiving the first control signal at a gate of the first transistor;

receiving the second control signal at a gate of the second transistor;

receiving the second control signal at a gate of the third transistor; and receiving the first control signal at a gate of the fourth transistor.

17. The method of claim 14, wherein receiving the first control signal and the second control signal at the second switching circuitry comprises:
- receiving the first control signal at a gate of a fifth transistor connected to the reference voltage node;
- receiving the second control signal at a gate of a sixth transistor connected in series with the fifth transistor and to the second path;
- receiving the second control signal at a gate of a seventh transistor connected to the reference voltage node; and
- receiving the first control signal at a gate of an eighth transistor connected in series with the seventh transistor and to the second path.

18. The method of claim 14, wherein the second control signal is delayed with reference to the first control signal.

* * * * *